US010394223B2

(12) United States Patent
Barr et al.

(10) Patent No.: US 10,394,223 B2
(45) Date of Patent: *Aug. 27, 2019

(54) DEVICE FOR CONTROLLING ADDITIVE MANUFACTURING MACHINERY

(71) Applicant: Honeywell Federal Manufacturing & Technologies, LLC, Kansas City, MO (US)

(72) Inventors: Christian Barr, Kansas City, MO (US); Wesley Everhart, Overland Park, KS (US)

(73) Assignee: Honeywell Federal Manufacturing & Technologies, LLC, Kansas City, MO (US)

(*) Notice: Subject to any disclaimer, the term of this patent is extended or adjusted under 35 U.S.C. 154(b) by 1 day.

This patent is subject to a terminal disclaimer.

(21) Appl. No.: 15/599,048

(22) Filed: May 18, 2017

(65) Prior Publication Data

US 2018/0239336 A1    Aug. 23, 2018

Related U.S. Application Data

(63) Continuation-in-part of application No. 15/250,562, filed on Aug. 29, 2016.

(51) Int. Cl.
*G05B 19/4099* (2006.01)
*B33Y 30/00* (2015.01)
(Continued)

(52) U.S. Cl.
CPC ........ *G05B 19/4099* (2013.01); *B22F 3/1055* (2013.01); *B23K 15/0086* (2013.01);
(Continued)

(58) Field of Classification Search
CPC . B29C 64/153; B29C 64/268; G05B 19/4099; B23K 15/0086; B23K 15/02
See application file for complete search history.

(56) References Cited

U.S. PATENT DOCUMENTS

| 5,904,890 A * | 5/1999 | Lohner | B33Y 10/00 264/308 |
| 2010/0065752 A1 * | 3/2010 | Dally | B01J 19/085 250/396 R |

(Continued)

*Primary Examiner* — Mohammad Ali
*Assistant Examiner* — Vincent W Chang
(74) *Attorney, Agent, or Firm* — Hovey Williams LLP

(57) ABSTRACT

A computing device for controlling the operation of an additive manufacturing machine comprises a memory element and a processing element. The memory element is configured to store a three-dimensional model of a part to be manufactured, wherein the three-dimensional model defines a plurality of cross sections of the part. The processing element is in communication with the memory element. The processing element is configured to receive the three-dimensional model, determine a plurality of paths, each path including a plurality of parallel lines, determine a radiation beam power for each line, such that the radiation beam power varies non-linearly according to a length of the line, and determine a radiation beam scan speed for each line, such that the radiation beam scan speed is a function of a temperature of a material used to manufacture the part, the length of the line, and the radiation beam power for the line.

17 Claims, 7 Drawing Sheets

(51) Int. Cl.
*B23K 15/00* (2006.01)
*B23K 15/02* (2006.01)
*B23K 15/06* (2006.01)
*G05B 19/416* (2006.01)
*H01J 37/305* (2006.01)
*H01J 37/302* (2006.01)
*B22F 3/105* (2006.01)
*B33Y 50/02* (2015.01)

(52) U.S. Cl.
CPC .............. *B23K 15/02* (2013.01); *B23K 15/06* (2013.01); *B33Y 30/00* (2014.12); *G05B 19/416* (2013.01); *H01J 37/305* (2013.01); *H01J 37/3026* (2013.01); *B22F 2003/1056* (2013.01); *B22F 2003/1057* (2013.01); *B22F 2203/11* (2013.01); *B22F 2999/00* (2013.01); *B33Y 50/02* (2014.12); *G05B 2219/49023* (2013.01); *Y02P 70/161* (2015.11)

(56) References Cited

U.S. PATENT DOCUMENTS

| | | | |
|---|---|---|---|
| 2013/0300035 A1* | 11/2013 | Snis | B22F 3/1055 264/497 |
| 2014/0174664 A1* | 6/2014 | Lee | C03C 27/00 156/380.9 |
| 2015/0283613 A1* | 10/2015 | Backlund | B33Y 10/00 419/53 |

* cited by examiner

DEVICE FOR CONTROLLING ADDITIVE MANUFACTURING MACHINERY

RELATED APPLICATION

The current patent application is a continuation-in-part patent application which claims priority benefit, with regard to all common subject matter, to U.S. patent application Ser. No. 15/250,562, entitled "DEVICE FOR CONTROLLING ADDITIVE MANUFACTURING MACHINERY", and filed Aug. 29, 2016. The earlier-filed patent application is hereby incorporated by reference in its entirety into the current application.

STATEMENT REGARDING FEDERALLY-SPONSORED RESEARCH OR DEVELOPMENT

This invention was made with government support under Contract No.: DE-NA0002839 awarded by the Department of Energy. The government has certain rights in the invention.

BACKGROUND OF THE INVENTION

Field of the Invention

Embodiments of the current invention relate to devices for controlling the operation of additive manufacturing machinery.

Description of the Related Art

Additive manufacturing machinery creates parts using processes that add material in successive steps to form the part as opposed to traditional, subtractive processes that start with a block of raw material and then remove a portion of the material, such as by machining, to form the final part. An additive manufacturing machine may also be referred to as a 3D printer. An example of an additive manufacturing machine is an electron beam melt (EBM) machine. The EBM machine may include a raw material bed, an electron beam generator, and a controller. The raw material bed may be a square or rectangular plate that retains raw material and is held in a vertical shaft. Typically, the raw material is a powdered metal or metal alloy. The electron beam generator may be positioned above the raw material bed and may generate an electron beam onto the raw material in the bed. The electron beam possesses sufficient power to melt particles of the raw material and fuse them together. The controller generally controls the power and the relative motion of the electron beam.

The EBM machine may operate as follows. A three-dimensional computer model of the part may be created. The model includes coordinates of the material boundaries or surface area dimensions for each of a plurality of thin, parallel, planar cross sections of the part. The model may be loaded into the controller for the electron beam generator. A first layer of raw material may be deposited onto the raw material bed by a material dispenser or hopper. The electron beam may be guided to scan a path to melt and fuse the raw material that lies within the boundaries of the first cross section of the part. Typically, the path includes a serpentine pattern of spaced-apart parallel lines. After all of the raw material that forms the first cross section of the part has been melted and fused, the raw material bed lowers in the shaft by a distance equal to one cross-sectional thickness. A second layer of raw material is deposited into the bed on top of the first layer. The electron beam may be guided in a path to melt and fuse the raw material that lies within the boundaries of the second cross section of the part. Once fusing and melting is complete, the raw material bed lowers in the shaft and another layer of raw material is added on top of the previous layer. The process continues until all cross sections of the part have been formed. The part is complete when excess raw material has been removed.

The quality of the completed part relies, to a certain extent, on proper heating and cooling of the material along adjacent path lines of the electron beam. As the beam moves along one path line, it will heat the material along adjacent path lines. If the material that has already been melted at a point along a previously-scanned path line cools too much before the electron beam arrives at the same point on the currently-scanned, adjacent path line, then defects, such as high surface porosity and microcracks, may occur. The heating and cooling behavior of the raw material may result from the intrinsic thermal conductivity properties of the metals and alloys used. Some raw material metals, such as aluminum, copper, gold, silver, and their alloys, have a higher thermal conductivity than other metals, such as carbon steel. The metals and alloys with higher thermal conductivity will cool more rapidly than those with lower thermal conductivity. In addition, areas of a cross section of the part with longer path lines may experience a longer time from when the electron beam leaves a given point on a previously-scanned path line until the beam intersects the same point on the currently-scanned, adjacent path line. During the longer time, the material at the given point could cool to an undesirable level before it is heated up again. These issues prevent current additive manufacturing machinery from producing high quality parts from a variety of metals.

SUMMARY OF THE INVENTION

Embodiments of the current invention solve the above-mentioned problems and provide a distinct advance in the art of control of additive manufacturing machinery. More particularly, embodiments of the invention provide computing devices for controlling additive manufacturing machinery that compensate for variations in raw material thermal conductivity and the length of electron beam path lines by allowing an electron beam generator to vary a power of the electron beam and/or vary a speed at which the electron beam travels along the path lines.

An exemplary computing device comprises a memory element and a processing element. The memory element may be configured to store a three-dimensional model of a part to be manufactured, wherein the three-dimensional model defines a plurality of cross sections of the part. The processing element may be in electronic communication with the memory element. The processing element may be configured to receive the three-dimensional model, determine a plurality of paths, one path across a surface of each cross section, each path including a plurality of parallel lines, determine a plurality of radiation beam powers, one radiation beam power for each line of each path, such that the radiation beam power varies from line to line non-linearly according to a length of the line, and determine a plurality of radiation beam scan speeds, one radiation beam scan speed for each line of each path, such that the radiation beam scan speed is a function of a temperature of a material used to manufacture the part, the length of the line, and the radiation beam power for the line.

Another aspect of the invention provides an electron beam melt machine comprising an electron beam generator and a computing device. The electron beam generator may be configured to generate an electron beam which is utilized to melt and fuse raw material to manufacture a part. The computing device may control the operation of the electron beam melt machine and may comprise a memory element and a processing element. The memory element may be configured to store a three-dimensional model of the part, wherein the three-dimensional model defines a plurality of cross sections of the part. The processing element may be in electronic communication with the memory element. The processing element may be configured to receive the three-dimensional model, determine a plurality of paths, one path across a surface of each cross section, each path including a plurality of parallel lines, determine a plurality of electron beam powers, one electron beam power for each line of each path, such that the electron beam power varies from line to line non-linearly according to a length of the line, and determine a plurality of electron beam scan speeds, one electron beam scan speed for each line of each path, such that the electron beam scan speed is a function of a temperature of a material used to manufacture the part, the length of the line, and the electron beam power for the line.

Yet another aspect of the invention provides a method for controlling the operation of an electron beam melt machine. The method comprises the steps of: receiving a three-dimensional model including data defining a plurality of cross sections of a part to be manufactured, determining a plurality of paths, one path across a surface of each cross section, each path including a plurality of parallel lines, determining a plurality of electron beam powers, one electron beam power for each line of each path, such that the electron beam power varies from line to line non-linearly according to a length of the line, and determining a plurality of electron beam scan speeds, one electron beam scan speed for each line of each path, such that the electron beam scan speed is a function of a temperature of a material used to manufacture the part, the length of the line, and the electron beam power for the line.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figure 1:
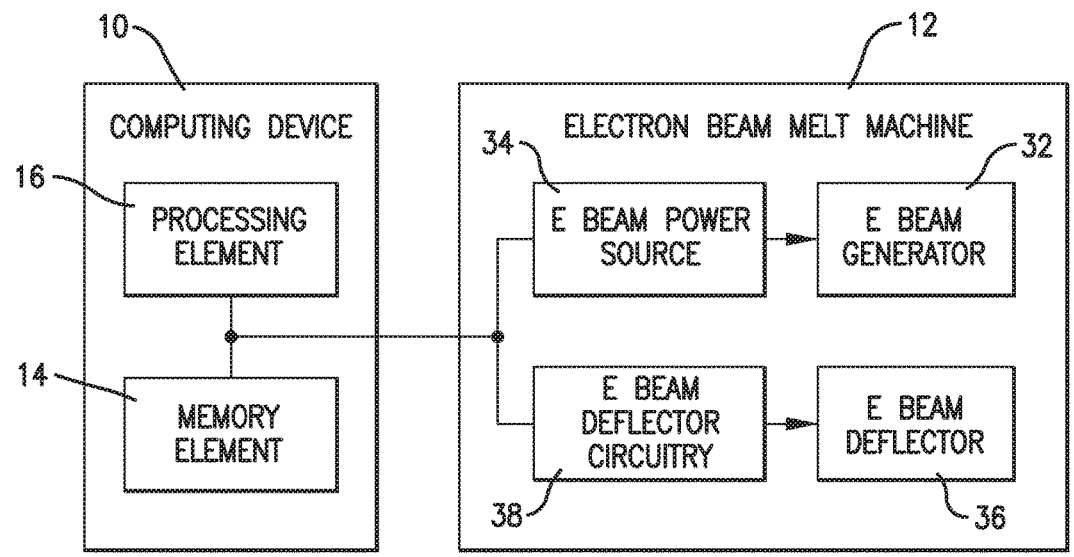
FIG. 1 is a schematic block diagram of components of a computing device, constructed in accordance with various embodiments of the current invention, in electronic communication with components of an electron beam melt machine.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

A computing device 10, constructed in accordance with various embodiments of the current invention, for controlling the operation of additive manufacturing machinery, such as an electron beam melt (EBM) machine 12, is shown in FIG. 1. The computing device 10 may broadly comprise a memory element 14 and a processing element 16 which interact with electronic components of the EBM machine 12 to control the power and motion of a radiation beam—specifically, an electron beam 18, also referred to herein as an "e beam" 18. In some embodiments, the computing device 10 may be integrated with, housed within, or considered part of the EBM machine 12. In other embodiments, the computing device 10 may be a standalone unit that is in electronic communication with the EBM machine 12. The computing device 10 and/or the EBM machine 12 may further comprise a display, a user interface such as a keyboard and mouse, a communication element to allow the device 10 and/or machine 12 to communicate wirelessly or through wires with other devices or systems, and so forth.

Figure 2:
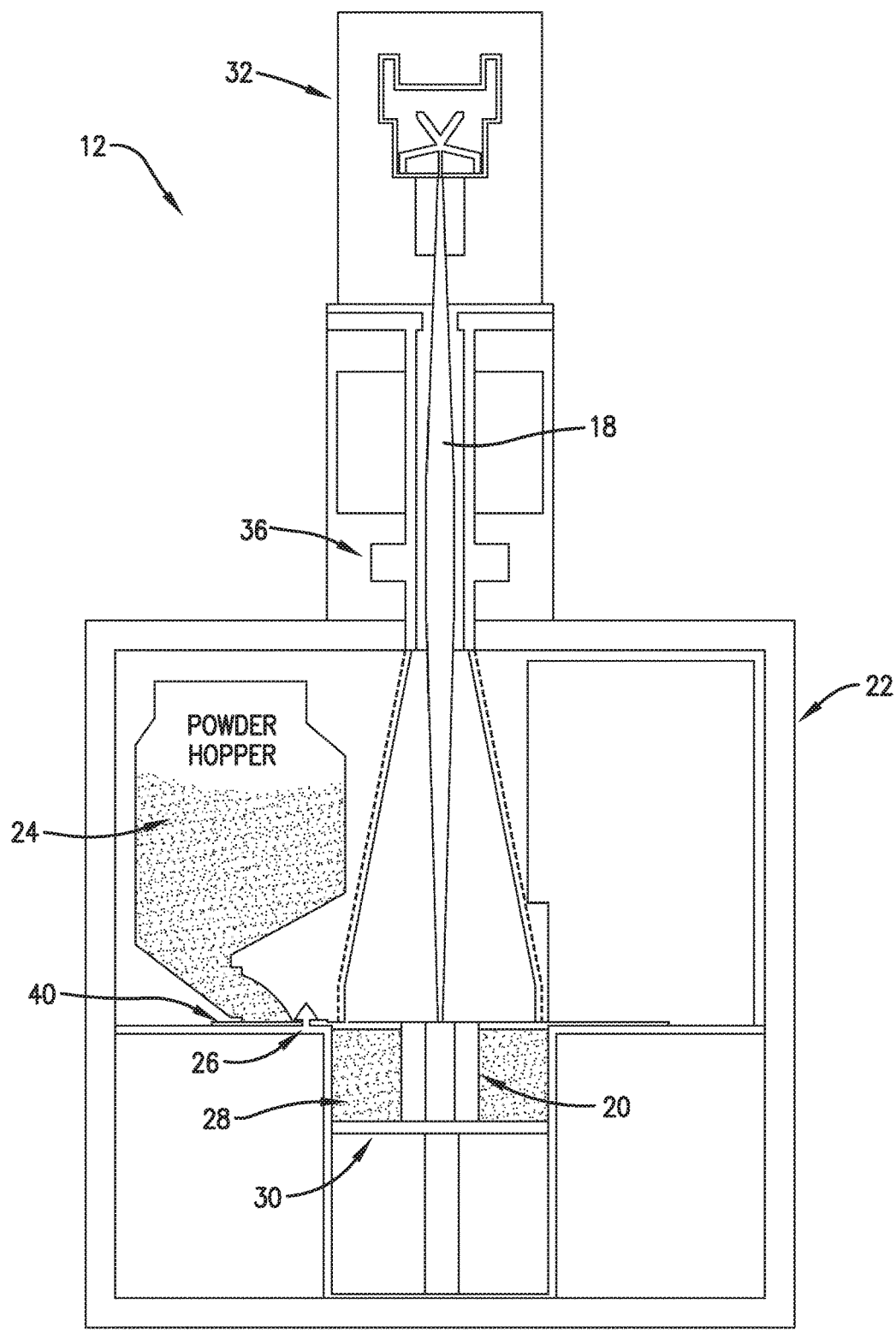
FIG. 2 is a front sectional view of the electron beam melt machine, including an electron beam generator generating an electron beam onto a raw material plate which retains raw material that is melted and fused to manufacture a part.

At least a portion of an exemplary EBM machine 12 is shown in FIG. 2 utilizing the e beam 18 to create a part 20. The EBM machine 12 may comprise a housing 22, one or more raw material hoppers 24, a rake 26, a build tank 28, a raw material plate 30, an e beam generator 32, an e beam power source 34, e beam deflector 36, and an e beam deflector circuitry 38.

The housing 22 generally stores at least a portion of the other components and forms a vacuum chamber during operation of the EBM machine 12. Exemplary embodiments of the housing 22 include four side walls, a top wall, and a bottom wall formed from high strength materials such as steel. One or more of the walls may have openings to provide access to other components and/or may be removable.

The raw material hopper 24 generally retains a supply of raw material to be delivered to build tank 28. Typically, the raw material is a powdered form of one or more metals, such as aluminum, copper, gold, silver, titanium, cobalt, chrome, carbon steel, or the like, or alloys, such as aluminum 6061, aluminum 7075, titanium T6Al4V, and so forth. The raw material hopper 24 may have a generally box or cylindrical shape with an open top to receive raw material and a funneled bottom. The raw material hopper 24 may also include a side chute with a slidable door that opens to release the raw material. The EBM machine 12 may further include a landing 40 located beside the build tank 28 onto which raw material is deposited from the raw material hopper 24. In embodiments of the EBM machine 12 with two raw material hoppers 24, the hoppers 24 are positioned on opposing sides of the build tank 28.

The rake 26 generally pushes the raw material from the landing 40 under the raw material hopper 24 into the build tank 28. The rake 26 may be elongated and have a triangular, rectangular, or square cross-section with one or more edges that contact the raw material. The EBM machine 12 may include actuating devices that push and/or pull the rake 26 in order to move the raw material.

The build tank 28 generally retains the raw material in place while a part is being formed. The build tank 28 may include four vertically-oriented walls that form a shaft through which the raw material bed can slide. The build tank 28 may be positioned in the center of the lower half of the housing 22.

The raw material plate 30 generally retains one layer of raw material that is used to form a portion of the part 20. The raw material plate 30 may have a thin two-dimensional shape, such as circular, oval, rectangular, square, octagonal, etc., and may be constructed from metals or similar hardened materials. Various embodiments of the raw material plate 30 may include a non-stick coating on an upper surface thereof. The raw material plate 30 may be positioned within the build tank 28 such that the edges of the raw material plate 30 contact the sides of the build tank 28. In other embodiments, the raw material plate 30 may have a surface area that is smaller than the area of the opening of the build tank 28, such that there is a gap between the edges of the raw material plate 30 and the sides of the build tank 28. An arm may be connected to the bottom surface of the raw material plate 30 which actuates the plate 30 up and down within the build tank 28. Alternatively, the bottom surface of the raw material plate 30 may be connected to another plate which itself is actuated, so that the combination of the plate 30 and the plate move up and down within the build tank 28.

The e beam generator 32 generally provides the e beam 18 and may include known electron beam generation and acceleration components such as a high-voltage filament/cathode/anode combination, lenses, coils, or other components to prevent astigmatism and focus the beam, and the like. The power or energy of the e beam 18 may be proportional to an electric current, voltage, or other electrical characteristic received by the e beam generator 32. The e beam generator 32 may be positioned on an upper surface of the top wall of the housing 22 and may generate the e beam 18 downward through an opening in the top wall.

The e beam power source 34 generally controls the power delivered by the e beam 18 by controlling the electric current supplied to the e beam generator 32. The e beam power source 34 may include transformers, rectifiers, regulators, amplifiers, filters, and the like, all of which are capable of handling large values of electric current and/or voltage. The e beam power source 34 may receive a signal, data, or combinations thereof from the computing device 10. The signal may include a current, a voltage, a resistance, or the like which is amplified, transformed, used as a trigger, or otherwise modified to set the value of the electric current supplied to the e beam generator 32. The data from the computing device 10 may provide instructions on electric current level control or a sequence of values for the electric current supplied to the e beam generator 32. In other embodiments, the e beam power source 34 may alternatively or additionally control a voltage or other electrical characteristic or property that is supplied to the e beam generator 32.

The e beam deflector 36 generally controls the motion of the e beam 18. The e beam deflector 36 may include one or more electric coils, one or more pairs of electric plates, or the like, or combinations thereof. The e beam deflector 36 may be positioned along the axis or trajectory of the e beam 18 such that the e beam 18 passes through the coils and/or between the plates. The e beam deflector 36 may generate magnetic and/or electric fields that steer or deflect the e beam 18 to follow the path lines to melt the raw material as discussed in more detail below.

The e beam deflector circuitry 38 generally controls the operation of the e beam deflector 36. The e beam deflector circuitry 38 may include transformers, rectifiers, regulators, amplifiers, filters, and the like. The e beam deflector circuitry 38 may receive a signal, data, or combinations thereof from the computing device 10. The signal may include a current, a voltage, a resistance, or the like which is amplified, transformed, used as a trigger, or otherwise modified to set a level of electric current, voltage, or other electrical characteristic or property that is supplied to the e beam deflector 36. The data from the computing device 10 may provide instructions, a sequence of values, or the like to set the level of electric current, voltage, or other electrical characteristic or property that is supplied to the e beam deflector 36.

Figure 3:
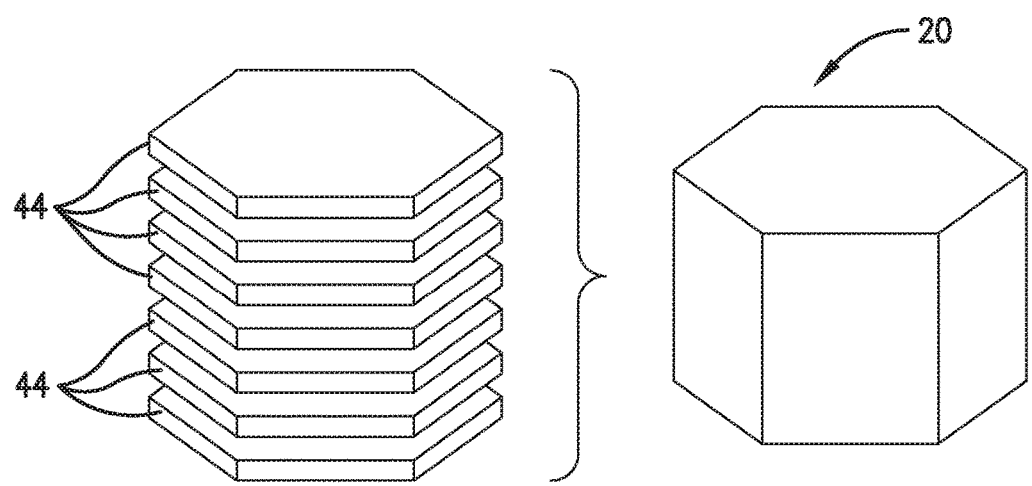
FIG. 3 is a front perspective view of the part along with virtual cross sections of the part.

The EBM machine 12 may operate as follows. A three-dimensional computer model of the part 20 to be manufactured is created. The model may include coordinates of material boundaries 42 or surface area dimensions for each of a plurality of cross sections 44 of the part 20. Each cross section 44 is a portion of the part 20 created by virtually sectioning the part 20 into thin, parallel, planar pieces. In an XYZ coordinate system, the sectioning may occur along the XY, YZ, or XZ plane or at angles to any of the planes. An exemplary part 20, shown in FIG. 3, may be a hexagonal block. Each cross section 44 is a disc whose boundaries 42 form a hexagon. The model may be created by scanning an already finished part 20 and then virtually sectioning the part 20 along a convenient plane.

Figure 4:
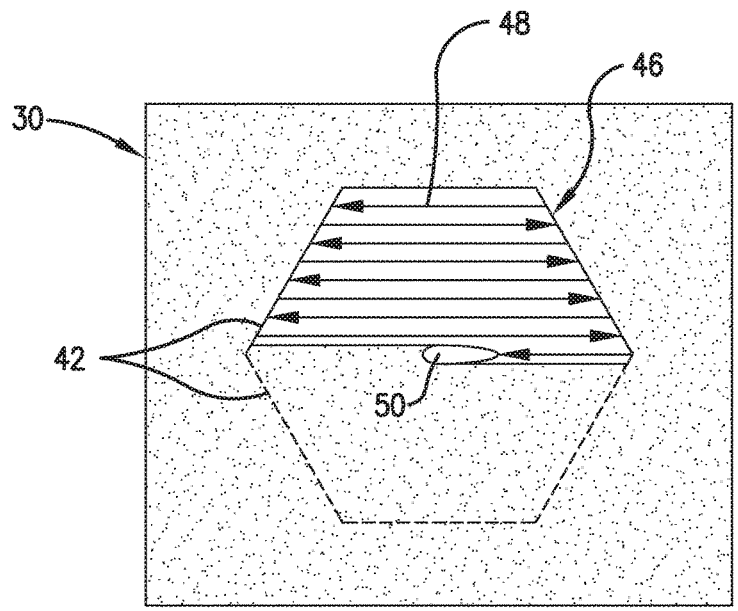
FIG. 4 is a top view of the raw material plate in isolation, depicting a layer of raw material on which the electron beam is scanning a path of parallel lines that melts and fuses the raw material to form a portion of one cross section of the part.

Raw material may be loaded into the raw material hopper 24 and a portion of the raw material may be released onto the landing 40. The raw material plate 30 may be positioned in the build tank 28 at a depth of one cross section 44 thickness. The rake 26 may push raw material into the raw material plate 30 such that the raw material is evenly distributed thereon. FIG. 4 shows the raw material plate 30 holding a layer of raw material. The e beam generator 32 may generate the e beam 18 onto the raw material. The computing device 10 may provide input to the e beam power source 34 and the e beam deflector circuitry 38 to control the power and the motion of the e beam 18, as described in more detail below. The e beam 18 is guided to scan or follow a path 46, which may be determined after the computer model for the part 20 is created. The path 46 may include a plurality of spaced-apart parallel lines 48 that follow a serpentine pattern. Typically, the path 46 begins at one edge or side of the boundary 42 for the current cross section 44, zig-zags back and forth across the surface, and ends at an opposing edge or side of the boundary 42. FIG. 4 shows the boundary 42 of the exemplary part 20 and illustrates the process of the e beam 18 following the path 46 during the formation of the current cross section 44. Although only a portion of the path 46 is shown in FIG. 4, the remainder of the path 46 includes the same serpentine pattern that zig-zags between edges of the boundary 42. FIG. 4 also shows a melt pool 50, which is the region around the e beam 18 spot where the raw material is melted. As the melted material cools, it fuses to form the cross section 44. Once the e beam 18 has been guided to scan the entire path 46, the e beam 18 is turned off.

The raw material plate 30 may be lowered in the build tank 28 by a distance equal to one cross-sectional thickness. The raw material hopper 24 may release more raw material, or there may be sufficient raw material left on the landing 40. In either case, the rake 26 may move a second layer of raw material into the raw material plate 30 to be placed on top of the first layer of unmelted raw material and the first cross section 44. The e beam generator 32 may generate the e beam 18 onto the raw material and may be guided to scan the path 46. If the second cross section 44 has the same shape as the first cross section 44, then the path 46 may be the same. If any of the cross sections 44 has a different shape than any of the others (such as from the boundary 42 of the cross section 44 being different), then there is a unique path 46 for each cross section 44 that has a different shape. And, although the path 46 may be different for differently shaped cross sections 44, the path 46 still follows the same serpentine pattern starting at one edge of the boundary 42 and ending at the opposite edge of the boundary 42. Once the e beam 18 has been guided along the entire path 46 for the second cross section 44, the e beam 18 is turned off. The raw material plate 30 is lowered in the build tank 28 by another cross-sectional thickness and another layer of raw material is placed on top of previous layers of raw material and previously-formed cross sections 44. The e beam 18 is guided along the path 46 to melt and form another cross section 44. The process of adding raw material and forming cross sections 44, as described above, continues all of the cross sections 44 have been formed. Excess raw material may be stuck to the cross sections 44. The excess raw material may be removed with pressurized air, brushing, and the like—after which, the part 20 is complete.

Focusing now on the computing device 10 that provides control of the operation of the EBM machine 12, the memory element 14 may include electronic hardware data storage components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. In some embodiments, the memory element 14 may be embedded in, or packaged in the same package as, the processing element 16. The memory element 14 may include, or may constitute, a "computer-readable medium". The memory element 14 may store the instructions, code, code segments, software, firmware, programs, applications, apps, services, daemons, or the like that are executed by the processing element 16. The memory element 14 may also store settings, data, documents, sound files, photographs, movies, images, databases, and the like.

The processing element 16 may include electronic hardware components such as processors, microprocessors (single-core and multi-core), microcontrollers, digital signal processors (DSPs), field-programmable gate arrays (FPGAs), analog and/or digital application-specific integrated circuits (ASICs), or the like, or combinations thereof. The processing element 16 may generally execute, process, or run instructions, code, code segments, software, firmware, programs, applications, apps, processes, services, daemons, or the like. The processing element 16 may also include hardware components such as finite-state machines, sequential and combinational logic, and other electronic circuits that can perform the functions necessary for the operation of the current invention. Furthermore, the processing element 16 may include electronic circuitry such as digital to analog converters, amplifiers, and so forth. The processing element 16 may be in communication with the other electronic components through serial or parallel links that include universal busses, address busses, data busses, control lines, and the like.

The processing element 16 may be configured or programmed, through hardware, firmware, software, or combinations thereof, to perform the following functions for controlling the operation of additive manufacturing machinery. The processing element 16 may receive, from an external device, machine, or system, the three-dimensional model of the part 20 to be created. The model may be stored in the memory element 14. The model may include surface area dimensions, coordinates of boundaries, and/or similar data that define each of the cross sections 44 of the part 20. From this data, the processing element 16 may generate the path 46 for each cross section 44. As best illustrated in FIG. 4, the path 46 includes a plurality of spaced-apart, parallel lines 48 that extend from one edge of the boundary 42 to another edge of the boundary 42.

Figure 5A:
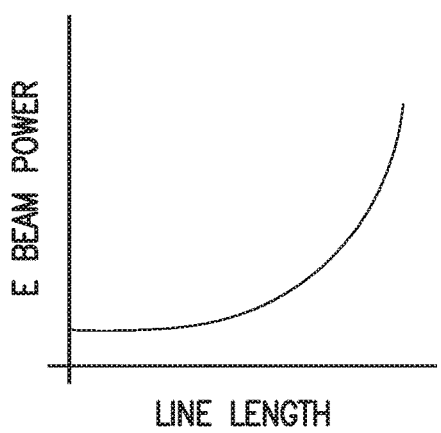
FIG. 5A is a plot of the electron beam power vs. the length of the lines of the path of FIG. 4.
Figure 5B:
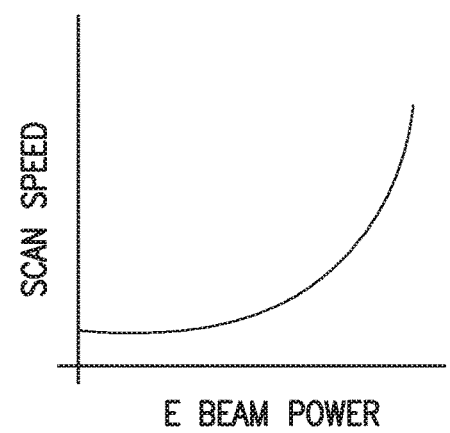
FIG. 5B is a plot of the electron beam scan speed vs. the electron beam power.

Once the path 46 for each cross section 44 is generated, the processing element 16 may determine the power of the e beam 18 and the speed with which the e beam scans or travels along each line 48. The e beam power and the e beam scan speed as the e beam 18 is guided, deflected, or steered to scan any given line 48 of the path 46 are generally constant for the entire length of the line 48, although, in some embodiments, the e beam power and the e beam scan speed may each be varied while the e beam 18 is scanning a line 48. However, the values of the e beam power and the e beam scan speed may be determined based on, or may vary according to, the length of the line 48. In general, there is a non-linear relationship between the length of the line 48 and the values of the e beam power and the e beam scan speed for that particular line 48. Specifically, as illustrated in the plot of e beam power vs. line length shown in FIG. 5A, the e beam power increases non-linearly with respect to the length of the line 48. The non-linear relationship between the length of the line 48 and the value of the e beam power may be expressed by equations that include exponential functions, logarithmic functions, polynomial functions, sinusoidal functions, etc. As illustrated in FIG. 5B, the e beam scan speed increases non-linearly with respect to the e beam power. Likewise, as above, the non-linear relationship between the e beam power and the value of the e beam scan speed may be expressed by equations that include exponential functions, logarithmic functions, polynomial functions, sinusoidal functions, etc. Thus, the processing element 16 increases the power of the e beam 18 exponentially, as an example, for an increase in the length of the line 48. And, the processing element 16 increases the scan speed of the e beam 18 exponentially, as an example, with an increase in the power of the e beam 18.

Furthermore, the processing element 16 may take into account the thermal properties, such as thermal conductivity, of the raw material used to manufacture the part 20 when calculating the e beam power and the e beam scan speed. In general, the values of e beam power and scan speed may be greater for a material with a higher thermal conductivity than a lower thermal conductivity material for a line of the same length. This helps to ensure that the higher thermal conductivity material does not cool too much during the scanning process. Thermal conductivity may be included in equations to calculate e beam power and scan speed as a variable scaling factor, a variable additive term, or the like.

In some embodiments, the processing element 16 may calculate the values of the e beam power and the e beam scan speed for each line 48 of each cross section 44 using equations mentioned above. The calculations may be performed for all of the lines 48 and stored in the memory element 14 before the e beam scanning process to form the part 20 begins. Alternatively, the calculation of the values of the e beam power and the e beam scan speed for each line 48 may be performed as needed, such as before each line 48 is scanned during the process of forming the part 20. In other embodiments, the values of the e beam power and the e beam scan speed for lines 48 of a plurality of lengths may be stored as a table in the memory element 14. For example, the values of the e beam power and the e beam scan speed for lines 48 ranging in length from 0 meters (m) to 2 m in 0.1 millimeter (mm) resolution may be stored in the memory element 14. Once the processing element 16 determines the length of each line 48, it may access the memory element 14 and look up the values of the e beam power and the e beam scan speed for the line length that is closest in value to the currently-determined length of the line 48.

Once the path 46 for each cross section 44 has been determined and the values of the e beam power and the e beam scan speed for each line 48 have either been calculated or are ready to be accessed, the processing element 16 may initiate the scanning and melting process that forms the part 20. The processing element 16 may communicate with the e beam power source 34 and the e beam deflector circuitry 38 to generate the e beam 18 with a certain power and to deflect, guide, steer, or move the e beam 18 to scan the path 46 with a certain scan speed. In some embodiments, the processing element 16 may transmit a first signal to the e beam power source 34, wherein the first signal includes an electrical characteristic, such as an electric current, a voltage, a resistance, etc., which is varied according to the value of the e beam power for the currently-scanned line 48. For example, the first signal having a greater electric current may correspond to a greater e beam power. In other embodiments, the processing element 16 may transmit data to the e beam power source 34 which includes instructions, a sequence of values, or the like that sets the level of the e beam power for the currently-scanned line 48. Likewise with the scan speed, the processing element 16 may transmit a second signal to the e beam deflector circuitry 38, wherein the second signal includes an electrical characteristic, such as an electric current, a voltage, a resistance, etc., which is varied according to the value of the e beam scan speed for the currently-scanned line 48. For example, the second signal having a greater electric current may correspond to a greater e beam scan speed. In other embodiments, the processing element 16 may transmit data to the e beam deflector circuitry 38 which includes instructions, a sequence of values, or the like that sets the level of the e beam scan speed for the currently-scanned line 48. The processing element 16 may also transmit a third signal or data to the e beam deflection circuitry 38 that provide the direction in which to guide, deflect, steer, or move the e beam 18 to scan the path 46.

The processing element 16 may continue to transmit signals and/or data the e beam power source 34 and the e beam deflector circuitry 38 that set values or levels for the e beam power, the e beam scan speed, and the e beam 18 direction for each line 48. The transmission may occur before each line 48 is scanned. In alternative embodiments, the e beam power source 34 and the e beam deflector circuitry 38 may include data storage components capable of storing a sequence of values. In such embodiments, the processing element 16 may transmit the data to the e beam power source 34 and the e beam deflector circuitry 38 for the e beam power, the e beam scan speed, and the e beam 18 direction for all the lines 48 of the path 46 before the scan and melt process begins. In addition, the processing element 16 may communicate with and provide control of components such as the raw material hopper 24, the rake 26, and the raw material plate 30. Thus, the processing element 16 may transmit signals and/or data to those components to set the height of the raw material plate 30, release raw material, and spread it on to the raw material plate 30 before each cross section 44 is formed. When all of the cross sections 44 have been formed, the processing element 16 may transmit an alert, such as activating a light, sounding an alarm, or sending a message, that the part 20 is complete.

Figure 6:
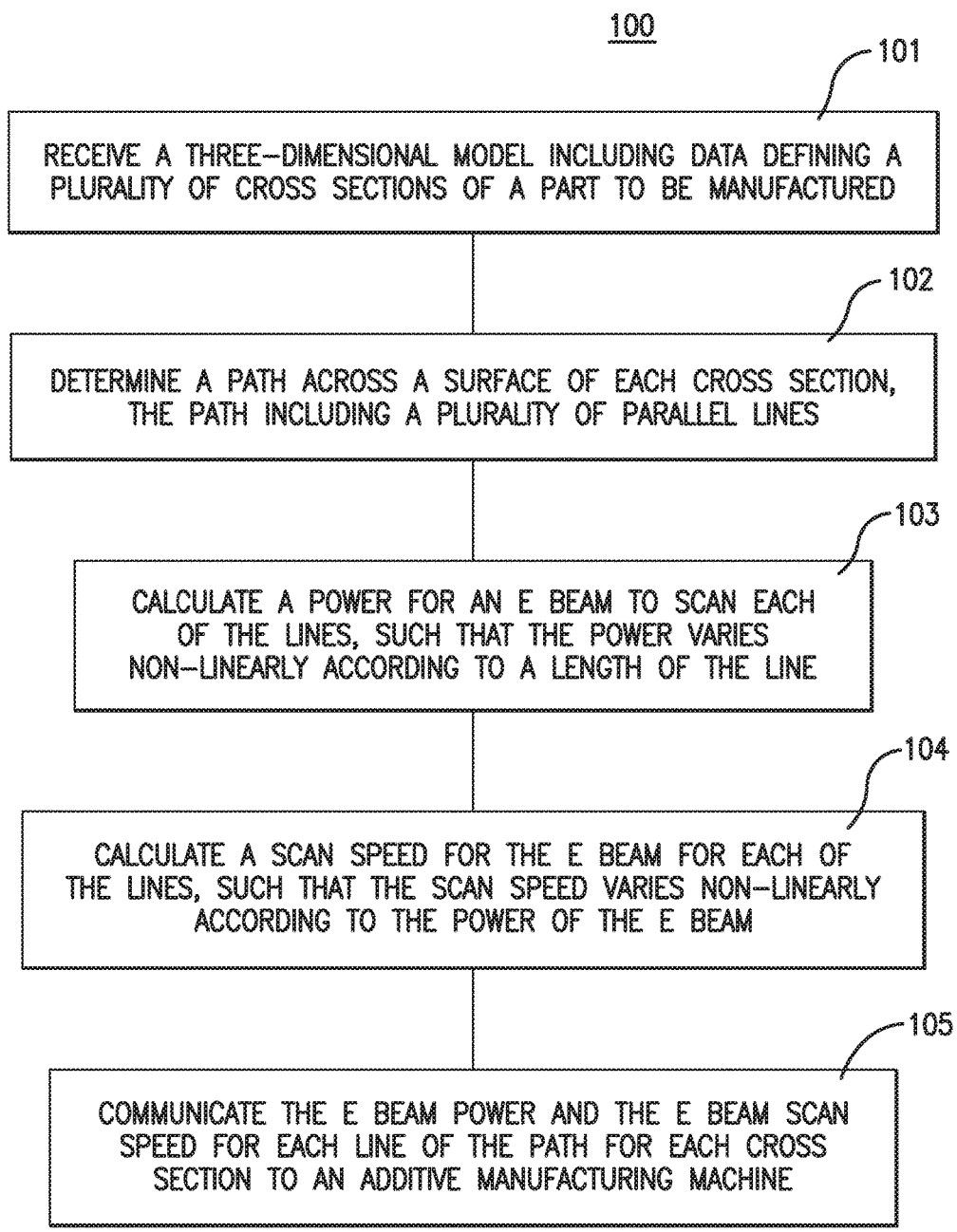
FIG. 6 is a listing of at least a portion of the steps of a method for controlling the operation of an electron beam melt machine.

Another aspect of the invention may provide a method 100 for controlling the operation of additive manufacturing machinery, such as an electron beam melt (EBM) machine 12. The EBM machine 12 may utilize an electron beam ("e beam") 18 to melt and fuse raw material in an additive manufacturing process to create a part 20. At least a portion of the steps of the method 100 are shown in FIG. 6. The steps may be performed in the order shown in FIG. 6, or they may be performed in a different order. Furthermore, some steps may be performed concurrently as opposed to sequentially. In addition, some steps may be optional. The steps may be performed by a processing element 16 of a computing device 10.

Referring to step 101, a three-dimensional model is received, the model including data defining a plurality of cross sections 44 of the part 20 to be manufactured. The model may include surface area dimensions, coordinates of boundaries 42, and/or similar data that define each of the cross sections 44 of the part 20. Each cross section 44 may be a portion of the part 20 created by virtually sectioning the part 20 into thin, parallel, planar pieces. In an XYZ coordinate system, the sectioning may occur along the XY, YZ, or XZ plane or at angles to any of the planes. An exemplary part 20, shown in FIG. 3, may be a hexagonal block. Each cross section 44 is a disc whose boundaries 42 form a hexagon. The model may be created by an external device, machine, or system which scans an already finished part 20 and then virtually sections the part 20 along a convenient plane.

Referring to step 102, a path 46 across a surface of each cross section 44 is determined. The path 46 may include a plurality of spaced-apart parallel lines 48 that follow a serpentine pattern. Typically, the path 46 begins at one edge or side of the boundary 42 for the current cross section 44, zig-zags back and forth across the surface, and ends at an opposing edge or side of the boundary 42. FIG. 4 shows the boundary 42 of the exemplary part 20 and illustrates the process of the e beam 18 following the path 46 during the formation of the current cross section 44. Although only a portion of the path 46 is shown in FIG. 4, the remainder of the path 46 includes the same serpentine pattern that zig-zags between edges of the boundary 42.

Referring to step 103, a power for the e beam 18 to scan each of the lines 48 is calculated. In general, there is a non-linear relationship between the length of the line 48 and the value of the e beam power for that particular line 48. Specifically, as illustrated in the plot of e beam power vs. line length shown in FIG. 5A, the e beam power increases non-linearly with respect to the length of the line 48. The non-linear relationship between the length of the line 48 and the value of the e beam power may be expressed by equations that include exponential functions, logarithmic functions, polynomial functions, etc. Thus, for longer lines 48, the processing element 16 increases the power of the e beam 18 exponentially, as an example.

Referring to step 104, a scan speed for the e beam 18 for each of the lines 48 is calculated. In general, there is a non-linear relationship between the length of the line 48 and the value of the e beam scan speed for that particular line 48. As illustrated in FIG. 5B, the e beam scan speed increases non-linearly with respect to the e beam power. Likewise, as above, the non-linear relationship between the e beam power and the value of the e beam scan speed may be expressed by equations that include exponential functions, logarithmic functions, polynomial functions, etc. When the e beam 18 is generated at higher power for longer lines 48, the processing element 16 increases the scan speed of the e beam 18 exponentially, as an example.

In some embodiments, the processing element 16 may calculate the values of the e beam power and the e beam scan speed for each line 48 of each cross section 44 using equations mentioned above. The calculations may be performed for all of the lines 48 and stored in the memory element 14 before the e beam scanning process to form the part 20 begins. Alternatively, the calculation of the values of the e beam power and the e beam scan speed for each line 48 may be performed as needed, such as before each line 48 is scanned during the process of forming the part 20. In other embodiments, the values of the e beam power and the e beam scan speed for lines 48 of a plurality of lengths may be stored as a table in the memory element 14. For example, the values of the e beam power and the e beam scan speed for lines 48 ranging in length from 0 meters (m) to 2 m in 0.1 millimeter (mm) resolution may be stored in the memory element 14. Once the processing element 16 determines the length of each line 48, it may access the memory element 14 and look up the values of the e beam power and the e beam scan speed for the line length that is closest in value to the currently-determined length of the line 48.

Referring to step 105, the e beam power and the e beam scan speed for each line 48 of the path 46 for each cross section 44 is communicated to an additive manufacturing machine. In some embodiments, the processing element 16 may transmit a first signal to the e beam power source 34, wherein the first signal includes an electrical characteristic, such as an electric current, a voltage, a resistance, etc., which is varied according to the value of the e beam power for the currently-scanned line 48. For example, the first signal having a greater electric current may correspond to a greater e beam power. Additionally or alternatively, the processing element 16 may transmit data to the e beam power source 34 which includes instructions, a sequence of values, or the like that sets the level of the e beam power for the currently-scanned line 48. Likewise with the scan speed, the processing element 16 may transmit a second signal to the e beam deflector circuitry 38, wherein the second signal includes an electrical characteristic, such as an electric current, a voltage, a resistance, etc., which is varied according to the value of the e beam scan speed for the currently-scanned line 48. For example, the second signal having a greater electric current may correspond to a greater e beam scan speed. Additionally or alternatively, the processing element 16 may transmit data to the e beam deflector circuitry 38 which includes instructions, a sequence of values, or the like that sets the level of the e beam scan speed for the currently-scanned line 48. The processing element 16 may also transmit a third signal and/or data to the e beam deflection circuitry 38 that provide the direction in which to guide, deflect, steer, or move the e beam 18 to scan the path 46.

The concepts and principles of the current invention apply generally to other radiation beam melt technologies. For example, selective laser melt machines operate on similar principles to the EBM machine 12. The selective laser melt machine includes a radiation beam generator, i.e., a laser, to generate a radiation beam, i.e., a laser beam, which is deflected or guided to scan a path, thereby melting and fusing raw material in order to manufacture a part. The selective laser melt machine may further include a power source for the laser along with electronic circuitry to set the level of laser power and laser beam deflection components, such as mirrors, splitters, and/or lenses, along with electronic circuitry to position the components. Thus, the computing device 10 of the current invention may interact with the selective laser melt machine in a similar manner to the EBM machine 12. For example, the three-dimensional model of the part 20 would be the same, so the processing element 16 may determine the path 46 for each cross section 44 in the same manner. Although the values of power for the laser beam may be different from the values of power for the e beam 18, the processing element 16 may calculate the power for the laser beam in the same manner. Hence, the laser beam power may vary non-linearly according to the lengths of the lines of the paths for each cross section. The processing element 16 may increase the laser beam power exponentially, as an example, for an increase in the length of the line. In addition, the processing element 16 may calculate the scan speed for the laser beam in the same manner as for the e beam 18. Hence, the laser beam scan speed may vary non-linearly according to the laser beam power for a given line. The processing element 16 may increase the laser beam scan speed exponentially, as an example, for an increase in the laser beam power. Furthermore, the values of the laser beam power and the laser beam scan speed for each line of a path may be communicated to the selective laser melt machine in a similar manner.

Figure 7:
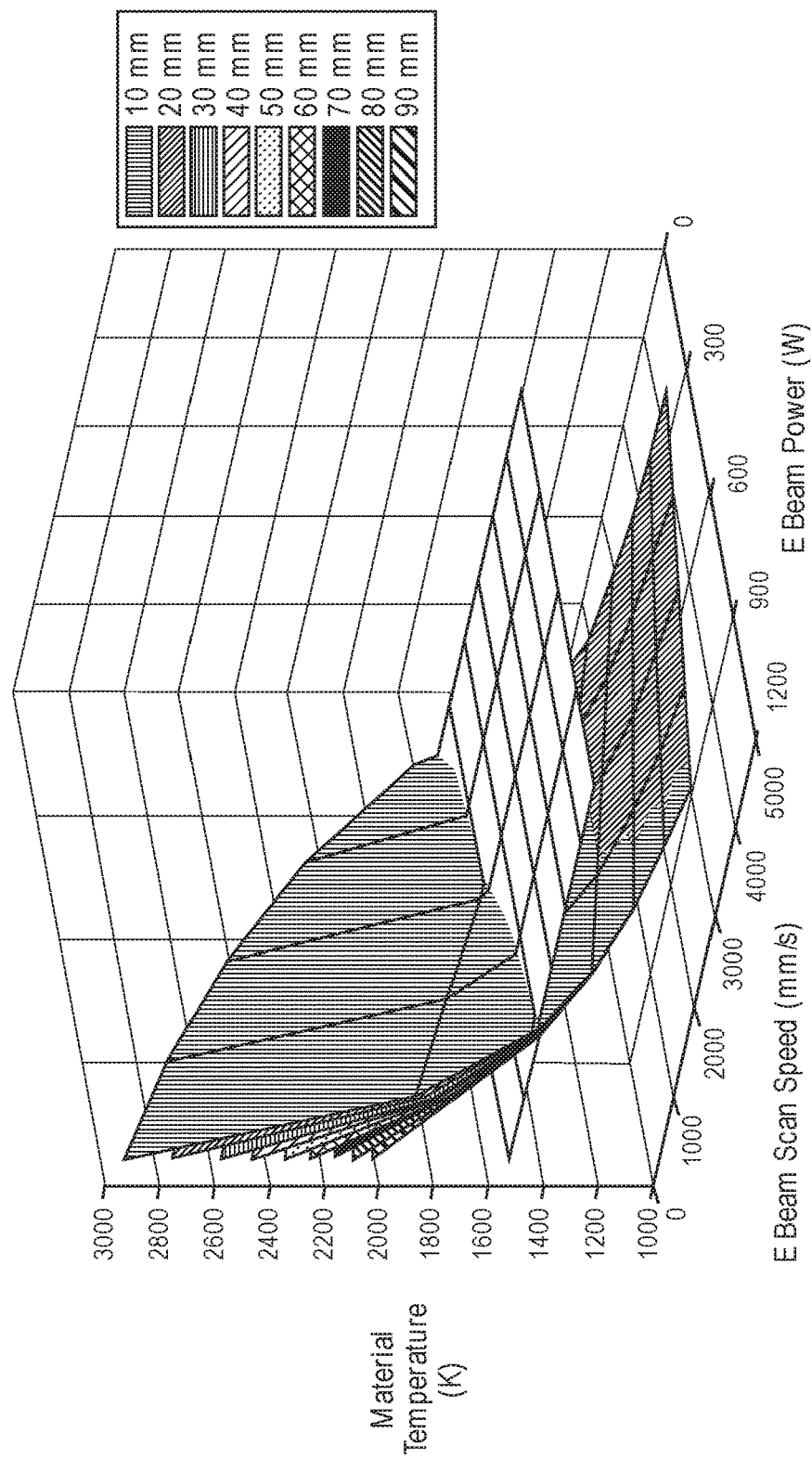
FIG. 7 is a three-dimensional plot of material temperature vs. electron beam scan speed vs. electron beam power for a plurality of lengths of lines.

A plot of a temperature of the raw material (such as exemplary alloy Ti-6Al-4V) versus scan speed and power of the e beam 18 for each of a plurality of lengths of lines 48 of the path 46 is shown in FIG. 7. The temperature of the material represents the temperature just as the material is struck and melted by the e beam 18 during the e beam 18 scanning phase of the manufacturing process. The plot shows a surface for each of nine lengths of lines 48, wherein for each length of the line 48, the e beam power and e beam scan speed are varied over the ranges shown in the plot. The length of the line 48 ranges from 10 millimeters (mm) to 90 mm with an increase of 10 mm per line 48. The plot generally demonstrates that the temperature of the material is greater at lower e beam scan speeds and/or higher e beam powers. The temperature of the material decreases as the e beam scan speed increases and/or the e beam power decreases. The plot may be generated by simulation using finite element thermal modeling, or by measurement of the material temperature at various combinations of length of the line 48, power of the e beam 18, and scan speed of the e beam 18.

It has been discovered that if the temperature of the material is held at a particular value just as it is struck and melted by the e beam 18, then the manufactured part 20 is produced with a minimal number of defects, such as microcracking and porosity. This preheating of the material to the particular temperature may be the result of the e beam 18 scanning the material, along the predetermined path 46, with an optimal power and at an optimal scan speed. In an additional embodiment of the computing device 10, the processing element 16 may further be configured and/or programmed to control the operation of additive manufacturing machinery to provide the optimal e beam power and e beam scan speed to hold the material at a particular temperature value just as it is struck and melted by the e beam 18. The additional configuration and/or programming may include the following.

The processing element 16 may receive information or data regarding the type of material to be used to manufacture the part 20. The material type, usually a metal or metal alloy, such as those discussed above, may be input through a user interface by a user, or may be sensed by a sensor in the raw material hopper 24. Based on the material type, the processing element 16 may calculate or determine an optimal value of the temperature for the material just as the e beam 18 strikes it and melts it. The optimal value of the temperature may vary according to the type of material and may be related to properties such as the coefficient of thermal conductivity. The determination may be made through retrieving the temperature value from a lookup table or database, or through calculations, such as solving one or more equations.

The processing element 16 may receive and store the model defining cross sections 44 of a part 20. The processing element 16 may also generate a plurality of paths 46 to be followed by the e beam 18, as described above—one path 46 for each cross section 44. Thus, a length of each line 48 may be determined. Given the length of each line 48, the processing element 16 may calculate or determine a plurality of e beam powers, one e beam power for each line 48, wherein the e beam power varies non-linearly according to the length of the line 48, such as is shown in the exemplary plot of FIG. 5A. Likewise, as described above, the non-linear relationship between the length of the line 48 and the value of the e beam power may be expressed by equations that include exponential functions, logarithmic functions, polynomial functions, etc. The determination may be made through calculations, such as solving one or more of the previously-mentioned equations, or through retrieving the e beam power value from a lookup table or database.

Figure 8:
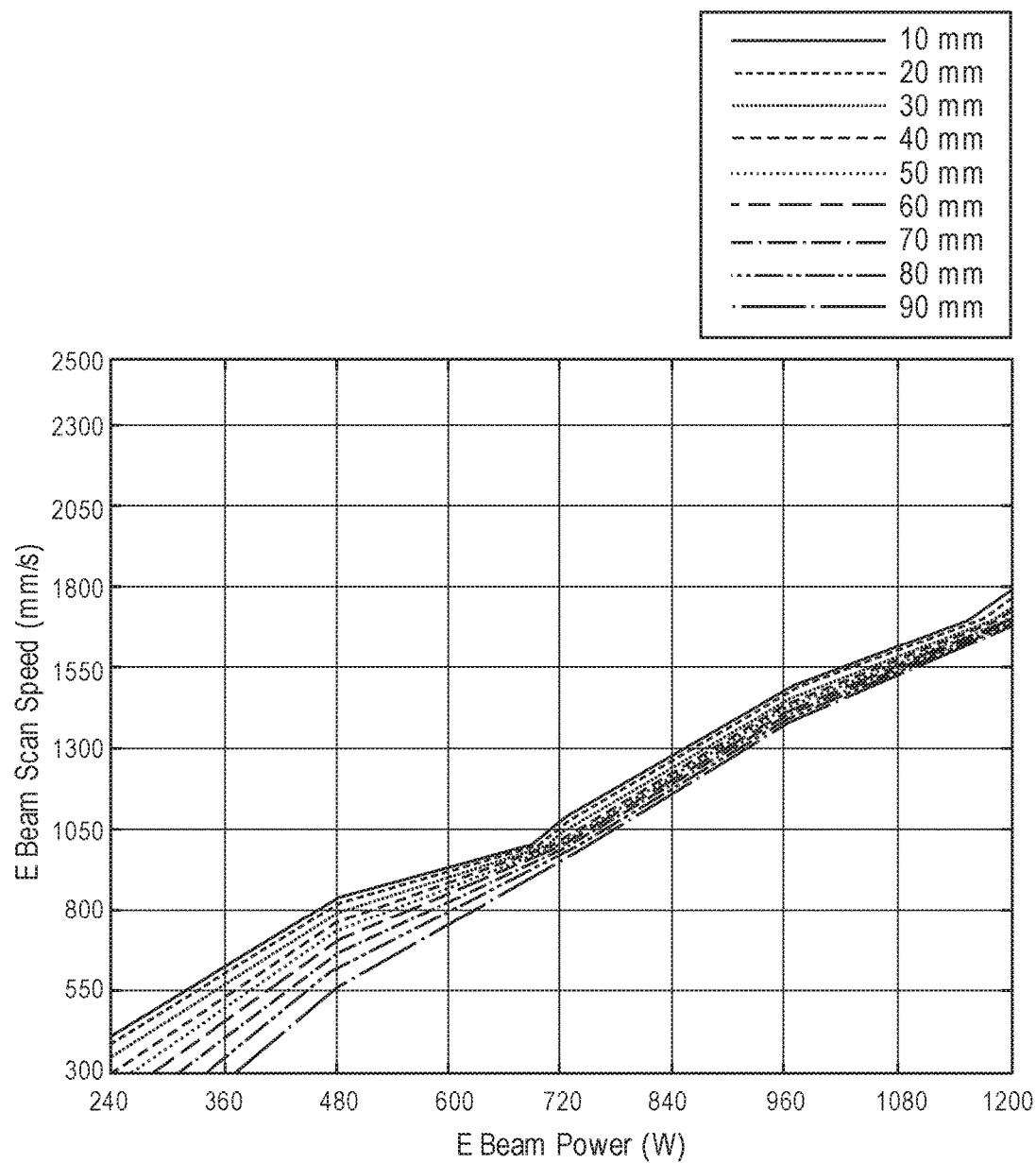
FIG. 8 is a plot of electron beam scan speed vs. electron beam power for a plurality of lengths of lines.

The processing element 16 may calculate or determine a plurality of e beam scan speeds, one e beam scan speed for each line 48 of the path 46 as a function of the temperature of the material, the length of the line 48, and the power of the e beam 18. An exemplary function may be shown in FIG. 8 as a plot of e beam scan speed vs e beam power for a plurality of lengths of lines 48 of the path 46. The plot shows a curve for each of nine lengths of lines 48, with the lengths ranging from 10 mm to 90 mm having an increase of 10 mm per line 48. The plot of FIG. 8 may be derived from the plot of FIG. 7. In various embodiments, the plot of FIG. 8 may be taken along an isothermal plane from FIG. 7 at the optimal value of the temperature, which is determined above. For instance, if the optimal value of the temperature is determined to be 1500 K, then a virtual isothermal plane is created at 1500 K in the plot of FIG. 7 and the intersection of the surfaces of the various line lengths with the isothermal plane is plotted in FIG. 8. Accordingly, determining the temperature of the material establishes the relationship between the e beam scan speed and e beam power for the various line lengths. In this case, the line length and the e beam power act as independent variables for determining the e beam scan speed. Thus, the processing element 16 may then determine the e beam scan speed using the known line length and e beam power by retrieving the temperature value from a lookup table or database, or through calculations, such as solving one or more equations. Since it is not likely that all of the lines 48 of a given path 46 have lengths that are integer multiples of a fixed line length (in this case, 10 mm yielding line lengths of 10 mm, 20 mm, 30 mm, etc.), the processing element 16 may use a linear interpolation to determine the values of e beam scan speed for line lengths that are non-integer multiples of the fixed line length. Hence, for a non-integer multiple of the fixed line length, the processing element 16 may calculate a value for the e beam scan speed which is linearly proportional between the values for the two closest fixed lengths for the given e beam power.

As an example, suppose the processing element 16 is to determine the e beam power and e beam scan speed for a line 48 with a length of 50 mm. Based on a non-linear relationship between the length of the line 48 and the e beam power, the processing element 16 may determine or calculate the electric current to be approximately 360 Watts (W). Next, the processing element 16 may utilize a relationship between the e beam scan speed and e beam power (which is established at a certain material temperature) for various line lengths such as the one shown in FIG. 8 to determine the e beam scan speed. For the line length of 50 mm and the e beam power of 360 W, the processing element 16 may determine the e beam scan speed to be approximately 500 mm/second (mm/s). If the line length is not an integer multiple of 10 mm, such as 25 mm, then the processing element 16 may interpolate by calculating a value that is halfway, in this example, between the values for 20 mm and 30 mm for the given e beam power.

With this embodiment of the computing device 10, the EBM machine 12 may function substantially similarly as it does in the description above with the raw material feed and e beam scanning process occurring in a substantially similar fashion. In addition, the processing element 16 may determine a plurality of e beam powers, one e beam power for each line 48 of each path 46 in the same fashion as discussed above—that is, the e beam power may vary non-linearly according to the length of the line 48. The difference between the current embodiment of the computing device 10 and the one described above is in the determination of a plurality of e beam scan speeds. The processing element 16 of the current embodiment may determine the e beam scan speed for each line 48 of each path as a function of a temperature of the material, the length of the line 48, and the e beam power for the line 48. Otherwise, the computing device 10 may control the operation of the EBM machine 12 as described above.

Figure 9:
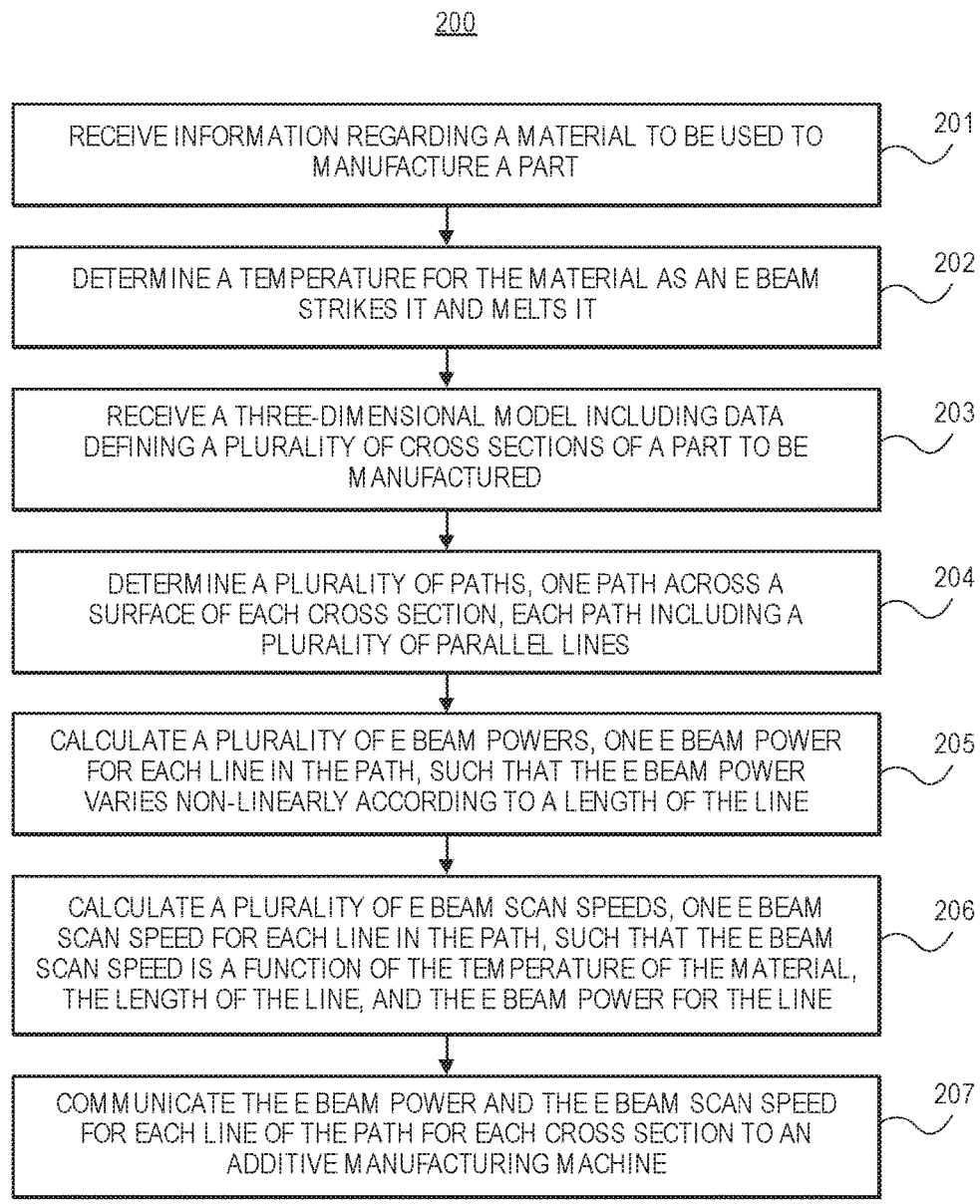
FIG. 9 is a listing of at least a portion of the steps of a method for controlling the operation of additive manufacturing machinery.

Yet another aspect of the invention may provide a method 200 for controlling the operation of additive manufacturing machinery, such as an electron beam melt (EBM) machine 12. The EBM machine 12 may utilize an electron beam ("e beam") 18 to melt and fuse raw material in an additive manufacturing process to create a part 20. At least a portion of the steps of the method 200 are shown in FIG. 9. The steps may be performed in the order shown in FIG. 9, or they may be performed in a different order. Furthermore, some steps may be performed concurrently as opposed to sequentially. In addition, some steps may be optional. The steps may be performed by a processing element 16 of a computing device 10.

Referring to step 201, information or data regarding the type of (raw) material to be used to manufacture a part 20 is received. The material type, usually a metal or metal alloy, such as those discussed above, may be input through a user interface by a user, or may be sensed by a sensor in a raw material hopper 24 for the EBM machine 12.

Referring to step 202, a temperature for the material as the e beam 18 strikes it and melts it is calculated or determined. The optimal value of the temperature may vary according to the type of material and may be related to properties such as the coefficient of thermal conductivity. The determination may be made through calculations, such as solving one or more equations, or through retrieving the temperature value from a lookup table or database. The material may reside on a raw material plate 30 as the e beam 18 scans along a path 46, melting the material as it contacts the material.

Referring to step 203, a three-dimensional model is received, the model including data defining a plurality of cross sections 44 of the part 20 to be manufactured. The model may include surface area dimensions, coordinates of boundaries 42, and/or similar data that define each of the cross sections 44 of the part 20. Each cross section 44 may be a portion of the part 20 created by virtually sectioning the part 20 into thin, parallel, planar pieces. In an XYZ coordinate system, the sectioning may occur along the XY, YZ, or XZ plane or at angles to any of the planes. An exemplary part 20, shown in FIG. 3, may be a hexagonal block. Each cross section 44 is a disc whose boundaries 42 form a hexagon. The model may be created by an external device, machine, or system which scans an already finished part 20 and then virtually sections the part 20 along a convenient plane.

Referring to step 204, a plurality of paths 46, one path 46 across a surface of each cross section 44, is determined. The path 46 may include a plurality of spaced-apart parallel lines 48 that follow a serpentine pattern. Typically, the path 46 begins at one edge or side of the boundary 42 for the current cross section 44, zig-zags back and forth across the surface, and ends at an opposing edge or side of the boundary 42. FIG. 4 shows the boundary 42 of the exemplary part 20 and illustrates the process of the e beam 18 following the path 46 during the formation of the current cross section 44. Although only a portion of the path 46 is shown in FIG. 4, the remainder of the path 46 includes the same serpentine pattern that zig-zags between edges of the boundary 42.

Referring to step 205, a plurality of e beam powers is calculated or determined, one e beam power for each of the lines 48 in each path 46. In general, there is a non-linear relationship between the length of the line 48 and the value of the e beam power for that particular line 48. Specifically, as illustrated in the plot of e beam power vs. line length shown in FIG. 5A, the e beam power increases non-linearly with respect to the length of the line 48. The non-linear relationship between the length of the line 48 and the value of the e beam power may be expressed by equations that include exponential functions, logarithmic functions, polynomial functions, etc. Thus, for longer lines 48, the processing element 16 increases the power of the e beam 18 exponentially, as an example. The determination may be made through calculations, such as solving one or more of the previously-mentioned equations, or through retrieving the e beam power value from a lookup table or database.

Referring to step 206, a plurality of e beam scan speeds is calculated, one e beam scan speed for each of the lines 48 in each path 46. Each e beam scan speed may be calculated or determined as a function of the temperature of the material, the length of the line 48, and the power of the e beam 18. An exemplary function may be shown in FIG. 8 as a plot of e beam scan speed vs e beam power for a plurality of lengths of lines 48 of the path 46. The plot shows a curve for each of nine lengths of lines 48, with the lengths ranging from 10 mm to 90 mm having an increase of 10 mm per line 48. The plot of FIG. 8 may be derived from the plot of FIG. 7. In various embodiments, the plot of FIG. 8 may be taken along an isothermal plane from FIG. 7 at the optimal value of the temperature, which is determined above. For instance, if the optimal value of the temperature is determined to be 1500 K, then a virtual isothermal plane is created at 1500 K in the plot of FIG. 7 and the intersection of the surfaces of the various line lengths with the isothermal plane is plotted in FIG. 8. Accordingly, determining the temperature of the material establishes the relationship between the e beam scan speed and e beam power for the various line lengths. In this case, the line length and the e beam power act as independent variables for determining the e beam scan speed. Thus, the processing element 16 may then determine the e beam scan speed using the known line length and e beam power by retrieving the temperature value from a lookup table or database, or through calculations, such as solving one or more equations. Since it is not likely that all of the lines 48 of a given path 46 have lengths that are integer multiples of a fixed line length (in this case, 10 mm yielding line lengths of 10 mm, 20 mm, 30 mm, etc.), the processing element 16 may use a linear interpolation to determine the values of e beam scan speed for line lengths that are non-integer multiples of the fixed line length. Hence, for a non-integer multiple of the fixed line length, the processing element 16 may calculate a value for the e beam scan speed which is linearly proportional between the values for the two closest fixed lengths for the given e beam power.

As an example, suppose the processing element 16 is to determine the e beam power and e beam scan speed for a line 48 with a length of 50 mm. Based on a non-linear relationship between the length of the line 48 and the e beam power, the processing element 16 may determine or calculate the electric current to be approximately 360 Watts (W). Next, the processing element 16 may utilize a relationship between the e beam scan speed and e beam power (which is established at a certain material temperature) for various line lengths such as the one shown in FIG. 8 to determine the e beam scan speed. For the line length of 50 mm and the e beam power of 360 W, the processing element 16 may determine the e beam scan speed to be approximately 500 mm/second (mm/s). If the line length is not an integer multiple of 10 mm, such as 25 mm, then the processing element 16 may interpolate by calculating a value that is halfway, in this example, between the values for 20 mm and 30 mm for the given e beam power.

Referring to step 207, the e beam power and the e beam scan speed for each line 48 of the path 46 for each cross section 44 is communicated to an additive manufacturing machine. In some embodiments, the processing element 16 may transmit a first signal to the e beam power source 34, wherein the first signal includes an electrical characteristic, such as an electric current, a voltage, a resistance, etc., which is varied according to the value of the e beam power for the currently-scanned line 48. For example, the first signal having a greater electric current may correspond to a greater e beam power. Additionally or alternatively, the processing element 16 may transmit data to the e beam power source 34 which includes instructions, a sequence of values, or the like that sets the level of the e beam power for the currently-scanned line 48. Likewise with the scan speed, the processing element 16 may transmit a second signal to the e beam deflector circuitry 38, wherein the second signal includes an electrical characteristic, such as an electric current, a voltage, a resistance, etc., which is varied according to the value of the e beam scan speed for the currently-scanned line 48. For example, the second signal having a greater electric current may correspond to a greater e beam scan speed. Additionally or alternatively, the processing element 16 may transmit data to the e beam deflector circuitry 38 which includes instructions, a sequence of values, or the like that sets the level of the e beam scan speed for the currently-scanned line 48. The processing element 16 may also transmit a third signal and/or data to the e beam deflection circuitry 38 that provide the direction in which to guide, deflect, steer, or move the e beam 18 to scan the path 46.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A computing device for controlling the operation of an additive manufacturing machine, the computing device comprising:
    a memory element configured to store a three-dimensional model of a part to be manufactured, the three-dimensional model defining a plurality of cross sections of the part; and
    a processing element in electronic communication with the memory element, the processing element configured to
        receive the three-dimensional model,
        determine a plurality of paths, one path across a surface of each cross section, each path including a plurality of parallel lines,
        receive a processing temperature for a material used to manufacture the part,
        determine a plurality of radiation beam powers, one radiation beam power for each line of each path, such that the radiation beam power varies logarithmically according to a length of the line for each line,
        determine a plurality of radiation beam scan speeds, one radiation beam scan speed for each line of each path, such that the radiation beam scan speed for each line is a function of the processing temperature of the material used to manufacture the part, the length of the line, and the radiation beam power for the line,
        generate a first signal to be received by a first component that controls power delivered by the radiation beam, control the power delivered to the radiation beam based on the first signal, the first signal including an electrical characteristic or data that varies according to each determined radiation beam power, and
        generate a second signal to be received by a second component that controls a motion of the radiation beam, control the motion of the radiation beam based on the second signal, the second signal including an electrical characteristic or data that varies according to each determined radiation beam scan speed.

2. The computing device of claim 1, wherein the processing temperature of the material establishes a relationship between the radiation beam scan speed and the radiation beam power for a plurality of lengths of the line and the processing element determines the radiation beam scan speed for each line from the relationship using the length of the line and the radiation beam power as independent variables.

3. The computing device of claim 1, wherein the processing element is further configured to communicate the radiation beam power and the radiation beam scan speed for each line of the path for each cross section to the additive manufacturing machine.

4. The computing device of claim 1, wherein the processing element is further configured to
    receive information regarding the material to be used to manufacture the part, and
    determine the processing temperature for the material as the radiation beam strikes it and melts it, wherein the processing temperature varies according to a type of the material.

5. The computing device of claim 1, wherein the radiation beam power to scan one line determined by the processing element is constant for the entire length of the line.

6. The computing device of claim 1, wherein the radiation beam scan speed to scan one line determined by the processing element is constant for the entire length of the line.

7. An electron beam melt machine comprising:
    an electron beam generator configured to generate an electron beam utilized to melt and fuse raw material to manufacture a part; and
    a computing device for controlling the operation of the electron beam melt machine, the computing device comprising
        a memory element configured to store a three-dimensional model of the part, the three-dimensional model defining a plurality of cross sections of the part, and
        a processing element in electronic communication with the memory element, the processing element configured to receive the three-dimensional model,
            determine a plurality of paths, one path across a surface of each cross section, each path including a plurality of parallel lines,
            determine a plurality of electron beam powers, one electron beam power for each line of each path, such that the electron beam power varies logarithmically according to a length of the line for each line, determine a plurality of electron beam scan speeds, one electron beam scan speed for each line of each path, such that the electron beam scan speed for each line is a function of a processing temperature of a material used to manufacture the part, the length of the line, and the electron beam power for the line, generate a first signal to be received by a first component that controls power delivered by the radiation beam, control the power delivered to the radiation beam based on the first signal, the first signal including an electrical characteristic or data that varies according to each determined radiation beam power, and generate a second signal to be received by a second component that controls a motion of the radiation beam, control the motion of the radiation beam based on the second signal, the second signal including an electrical characteristic or data that varies according to each determined radiation beam scan speed.

8. The electron beam melt machine of claim 7, wherein the processing temperature of the material establishes a relationship between the radiation beam scan speed and the radiation beam power for a plurality of lengths of the line and the processing element determines the radiation beam scan speed for each line from the relationship using the length of the line and the radiation beam power as independent variables.

9. The electron beam melt machine of claim 7, wherein the processing element is further configured to communicate the electron beam power and the electron beam scan speed for each line of the path for each cross section to the electron beam melt machine.

10. The computing device of claim 7, wherein the processing element is further configured to
receive information regarding the material to be used to manufacture the part, and
determine the processing temperature for the material as the electron beam strikes it and melts it, wherein the processing temperature varies according to a type of the material.

11. The electron beam melt machine of claim 7, wherein the electron beam power and the electron beam scan speed to scan one line determined by the processing element are each constant for the entire length of the line.

12. A method for controlling the operation of an electron beam melt machine, the method comprising the steps of:
receiving a three-dimensional model including data defining a plurality of cross sections of a part to be manufactured;

determining a plurality of paths, one path across a surface of each cross section, each path including a plurality of parallel lines;

determining a plurality of electron beam powers, one electron beam power for each line of each path, such that the electron beam power varies logarithmically according to a length of the line for each line;

determining a plurality of electron beam scan speeds, one electron beam scan speed for each line of each path, such that the electron beam scan speed is a function of a processing temperature of a material used to manufacture the part, the length of the line, and the electron beam power for the line;

generating a first signal to be received by a first component that controls power delivered by the radiation beam, controlling the power delivered to the radiation beam based on the first signal, the first signal including an electrical characteristic or data that varies according to each determined radiation beam power, and generating a second signal to be received by a second component that controls a motion of the radiation beam, controlling the motion of the radiation beam based on the second signal, the second signal including an electrical characteristic or data that varies according to each determined radiation beam scan speed.

13. The method of claim 12, wherein the processing temperature of the material establishes a relationship between the radiation beam scan speed and the radiation beam power for a plurality of lengths of the line and the method further comprises determining the radiation beam scan speed for each line from the relationship using the length of the line and the radiation beam power as independent variables.

14. The method of claim 12, further comprising communicating the electron beam power and the electron beam scan speed for each line of the path for each cross section to the electron beam melt machine.

15. The method of claim 12, further comprising
receiving information regarding the material to be used to manufacture the part, and
determining the processing temperature for the material as the electron beam strikes it and melts it, wherein the processing temperature varies according to a type of the material.

16. The method of claim 12, wherein the power for the electron beam to scan one line determined by the processing element is constant for the entire length of the line.

17. The method of claim 12, wherein the scan speed for the electron beam to scan one line determined by the processing element is constant for the entire length of the line.

* * * * *